United States Patent [19]
Sano et al.

[11] Patent Number: 5,250,797
[45] Date of Patent: Oct. 5, 1993

[54] EXPOSURE METHOD AND APPARATUS FOR CONTROLLING LIGHT PULSE EMISSION USING DETERMINED EXPOSURE QUANTITIES AND CONTROL PARAMETERS

[75] Inventors: Naoto Sano, Kunitachi; Tsutomu Asahina, Yokohama, both of Japan

[73] Assignee: Canon Kabushiki Kaisha, Tokyo, Japan

[21] Appl. No.: 771,221

[22] Filed: Oct. 4, 1991

[30] Foreign Application Priority Data

Oct. 5, 1990 [JP] Japan ................................. 2-266685
Sep. 4, 1991 [JP] Japan ................................. 3-250320

[51] Int. Cl.$^5$ ............................................. G01J 1/32
[52] U.S. Cl. ................................. 250/205; 250/548; 355/68
[58] Field of Search ................. 250/205, 548, 557; 372/29-31; 219/121.62, 121.63; 355/68

[56] References Cited

U.S. PATENT DOCUMENTS

| | | | |
|---|---|---|---|
| 4,785,192 | 11/1988 | Bruning | 250/548 |
| 5,028,797 | 7/1991 | Abe et al. | 356/401 |
| 5,053,614 | 10/1991 | Yui et al. | 250/205 |
| 5,134,273 | 7/1992 | Wani et al. | 250/205 |

FOREIGN PATENT DOCUMENTS 2155647 9/1985 United Kingdom .

*Primary Examiner*—David C. Nelms
*Assistant Examiner*—Stephone Allen
*Attorney, Agent, or Firm*—Fitzpatrick, Cella, Harper & Scinto

[57] ABSTRACT

A semiconductor device manufacturing exposure method usable with a pulsed light source is disclosed. The light source is caused to produce pulses of light in accordance with successively changed control parameters, while a sensor detects each pulse of light from the light source. Outputs of the sensor corresponding to the pulses of light are integrated to determine a quantity of exposure of a predetermined zone of a substrate corresponding to each light pulse. By using the determined exposure quantities corresponding to the pulses of light, a relational equation representing the relationship between each control parameter and a corresponding exposure quantity is determined. Then, a control parameter for subsequent light pulse emission of the light source is determined in accordance with the determined relational equation.

8 Claims, 5 Drawing Sheets

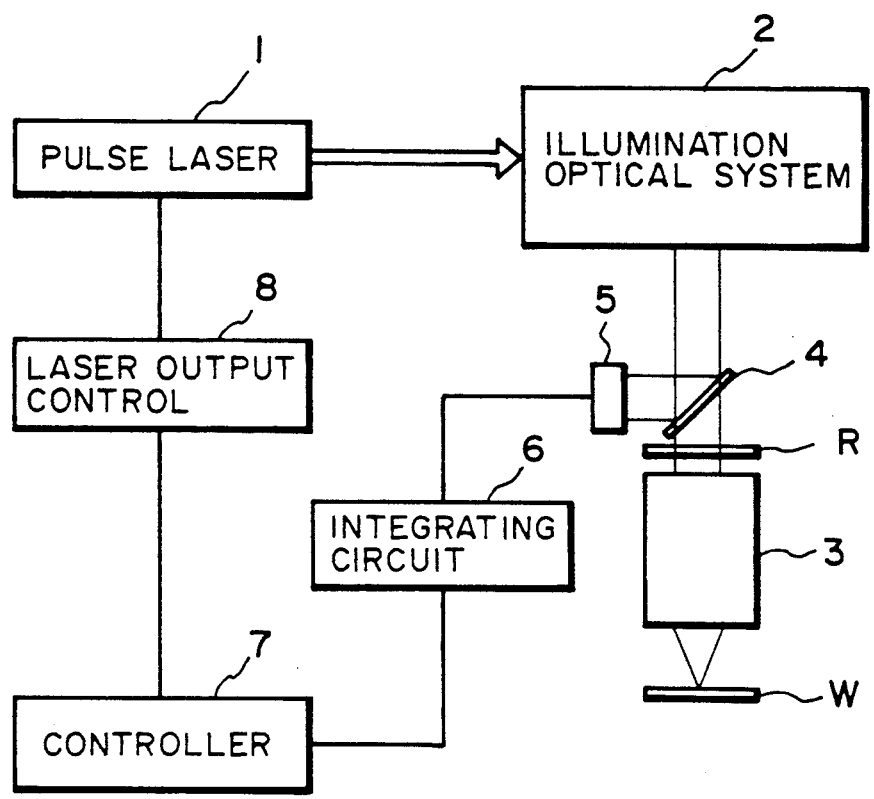
F I G. 1

EXPOSURE METHOD AND APPARATUS FOR CONTROLLING LIGHT PULSE EMISSION USING DETERMINED EXPOSURE QUANTITIES AND CONTROL PARAMETERS

FIELD OF THE INVENTION AND RELATED ART

This invention relates to an exposure method and apparatus using pulsed light. More particularly, the invention is concerned with an exposure method and apparatus suitably usable in a lithographic process of manufacture of semiconductor devices, for example, for exposing a semiconductor wafer to pulsed laser light from a pulsed laser source so as to form a fine pattern on the wafer.

The degree of integration and miniaturization of a semiconductor chip is increasing more and more. Recently, use of a deep ultraviolet light source such as an excimer laser which is a pulsed laser has been proposed as a light source means in a semiconductor device manufacturing exposure apparatus.

The pulse energy from such a pulsed laser contains fluctuation in magnitude of about 5% and, therefore, if such a pulsed laser (e.g. excimer laser) is used in an exposure apparatus, it may be necessary to control the energy of each laser pulse impinging on a wafer so as to assure a correct exposure amount of each zone of the wafer to be exposed.

As for such pulse energy control to attain correct exposure quantity, a pulsed laser light source itself may be controlled or, alternatively, an interference filter or a light attenuating filter may be used to attenuate the outputted laser pulse. An example of the former is disclosed in United Kingdom Patent Application GB 2,155,647A.

SUMMARY OF THE INVENTION

In addition to such energy variation of each light pulse, there is a problem of a change in output energy with time. For example, in an excimer laser which is a gas laser, there is a possibility that the gas used degrades with time. Also, there is a possibility of contamination of an optical part used in the laser. If such degradation of contamination occurs, then the output energy changes, regardless of that the same light emission control parameter (such as voltage, for example) is inputted to the laser.

FIG. 4 is a graph showing the relationship between a light emission control parameter (voltage) set to a laser device and its laser output (emitted light intensity). As seen in this drawing, for a constant control parameter X ($A \leq X \leq B$), the laser output ($Y \leq C$) changes with time within a range as depicted by arrows 41 and 42. Thus, when such a laser is used, there are cases wherein a desired pulse energy is not produced by changing the control parameter as desired.

It is accordingly an object of the present invention to provide an exposure apparatus suitably usable for exposing a substrate to a pattern of an original with light pulses from a pulsed light source so as to transfer the pattern of the original to the substrate, wherein correct exposure of the substrate is assured stably.

It is another object of the present invention to provide a semiconductor device manufacturing exposure apparatus by which correct exposure of each zone (shot area) of a wafer with light from a pulsed light source can be assured stably.

In accordance with an aspect of the present invention, during emission of pulses from a pulsed light source, a parameter for output energy control is changed successively while, on the other hand, the output energies of the light pulses are detected. On the basis of this detection, the relationship between the applied control parameter and the produced output energy from the pulsed light source is determined. Then, the succeeding emission of pulses of the pulsed light source is controlled by using the determined relationship.

In accordance with another aspect of the present invention, during successive exposures of a particular shot area of a wafer with pulses from a pulsed light source, the quantity of exposure of that shot area, being exposed, is monitored and the remainder (insufficiency) in comparison with a correct exposure quantity is calculated. Then, an average pulse energy for each of the light pulses necessary for attaining the correct exposure quantity, is calculated and the remaining pulse emission is controlled so that each pulse emission produces the calculated average pulse energy.

In accordance with at lease one of these aspects of the present invention, it is possible to attain a correct exposure quantity stably, irrespective of variation in energy of output pulses from a pulsed light source or of a change or degradation of the laser gas used or the optical part of the pulsed light source used.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a diagrammatic view showing a general structure of an exposure apparatus according to an embodiment of the present invention.

DESCRIPTION OF THE PREFERRED EMBODIMENTS

Figure 2:
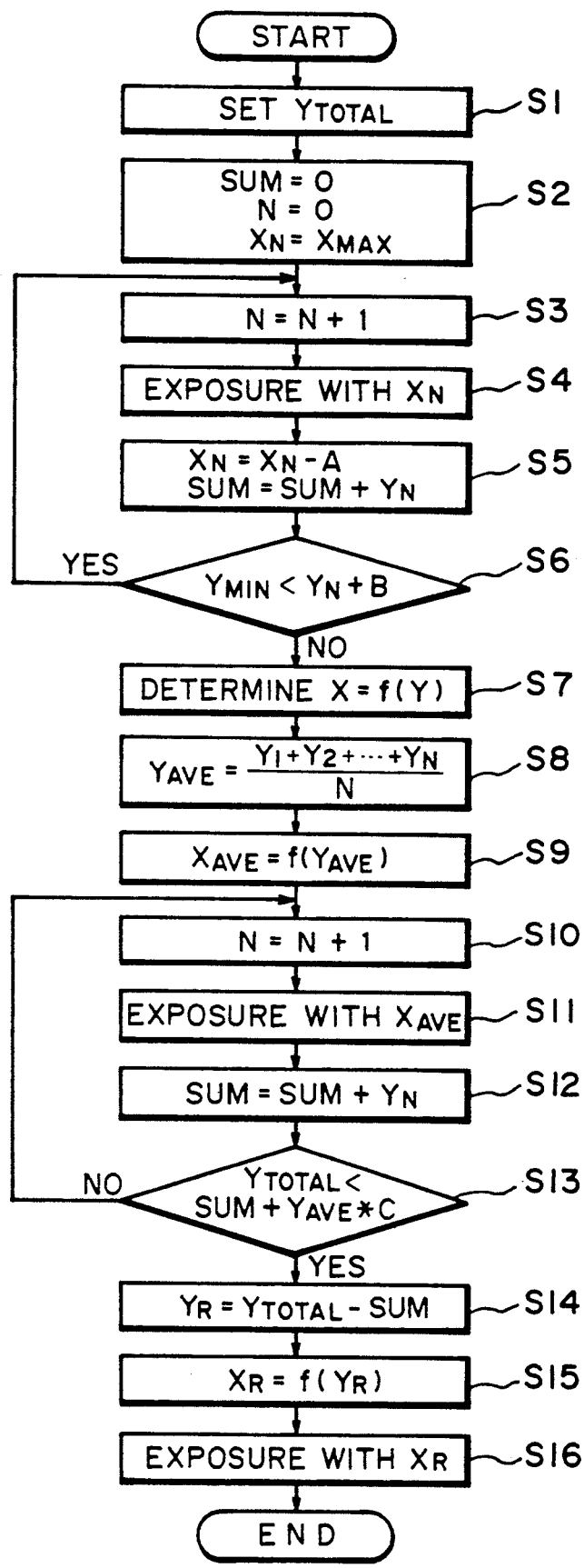
FIG. 2 is a flow chart showing the sequence of an exposure process to be made in the exposure apparatus of FIG. 1.

FIG. 1 shows a general structure of a reduction projection type exposure apparatus (called a "stepper") according to an embodiment of the present invention.

Denoted in this drawing at 1 is a laser light source (pulsed laser) such as an excimer laser having a KrF gas, for example, contained therein. This is the light source that emits pulsed laser light. This light source produces light having a wavelength of 248 nm in the deep ultraviolet region. Illumination optical system 2 includes a beam shaping optical system, an optical integrator, a collimator and a mirror, although they are not shown in the drawing. Each of these elements is made of a material effective to efficiently transmit or reflect the light in the deep ultraviolet region.

The beam shaping optical system serves to transform the beam into a desired shape, and the optical integrator serves to provide a uniform light distribution characteristic. Along the light path of the illumination optical system 2, a reticle or a mask R, having an integrated circuit pattern formed thereon, a projection optical system 3 and a wafer W are disposed.

Also, a mirror 4 is disposed in the light path of the illumination optical system, and a photosensor 5 for ultraviolet light is disposed on a light path reflected by the mirror 4. The output of this photosensor 5 is applied through an integrated circuit 6, for being converted into an exposure quantity per each pulse, and is applied to a controller 7 which calculates the integrated exposure quantity. Laser output control device 8 drives the excimer laser light source 1 on the basis of the result of calculation of the controller 7, such that the pattern of the reticle R is lithographically printed on the wafer with output light pulses each being controlled as required.

Since an output of an excimer laser is high, there are cases where, depending on the sensitivity of a resist used, use of a few pulses is sufficient for a single exposure. However, usually each pulse of the excimer laser contains an output variation of about 5% or more. Because of this, if in a fine process using a stepper or the like the exposure of one shot is effected only by using a few pulses, the variation is not neglected. In consideration of this, for a single exposure the number of pulses is increased to an order of about several tens, for example, with which the effect of the variation can be neglected.

Figure 5:
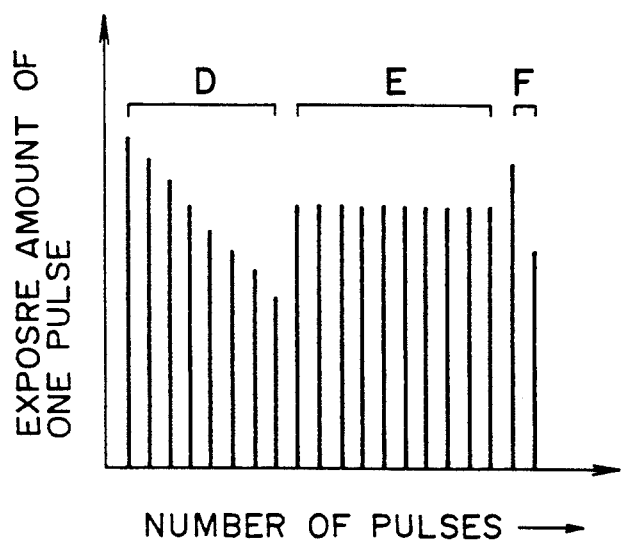
FIG. 5 is a graph showing changes in exposure quantity to be provided by light pulses, in accordance with the exposure sequence of FIG. 2.

Here, in the exposure apparatus of the present embodiment, during emission of the first few pulses to about ten pulses of a single exposure (pulse group D in FIG. 5), a control parameter such as the discharge voltage of the laser, for example, is changed (decreased). On the other hand, a table that represents the relationship between the control parameter and the actual laser output (quantity of exposure) of each pulse as can be detected through the sensor 5 and the integrating circuit 6, is prepared.

Table 1, below, shows the relationship between the voltage $X_N$ (N=1-9), which is a control parameter, and the laser output $Y_N$ (N=1-9).

TABLE 1

| VOLTAGE | LASER OUTPUT |
|---------|--------------|
| $X_1$ | $Y_1$ |
| $X_2$ | $Y_2$ |
| $X_3$ | $Y_3$ |
| $X_4$ | $Y_4$ |
| $X_5$ | $Y_5$ |
| $X_6$ | $Y_6$ |
| $X_7$ | $Y_7$ |
| $X_8$ | $Y_8$ |
| $X_9$ | $Y_9$ |

Based on this table, the controller 7 determines a relational equation regarding the voltage versus laser output. Levels at points between the set voltages may be complemented by linear scaling, for example. Then, voltage levels to be set for the last one pulse or the last few pulses in a single exposure (as included in pulse group E and/or F in FIG. 5) are determined on the basis of the obtained relational equation regarding the voltage versus laser output.

FIG. 2 shows details of the exposure sequence in the exposure apparatus of the present embodiment.

First, at step S2, the total exposure quantity $Y_{TOTAL}$ to be provided initially to a shot area on a wafer W, to be exposed, is set. Also, at step S2, initial levels for the integrated exposure quantity SUM, the number N of pulse emissions of the laser 1 and the discharge voltage $X_N$ to be set for the laser 1, are set. More specifically, the integrated exposure quantity SUM and the number N are set to be equal to "0", and the voltage level $X_N$ is set to be equal to the maximum set voltage level $X_{MAX}$.

At step S3, the number N is incremented and, at step S4, the laser 1 is energized under the control of the laser output control device 8 to effect light emission to execute the exposure of the reticle R and the wafer W, with the voltage set level $X_N$ being used as a control parameter. Further, at step S5, the level of set voltage $X_N$ is decreased by a quantity A, and a laser energy $Y_N$ actually detected through the sensor 5 and the integrated circuit 6 during the exposure effected with the set voltage level $X_N$ is added to the integrated exposure quantity SUM. Subsequently, at step S6, comparison is made to the minimum emission energy $Y_{MIN}$ of the laser 1 and the quantity $Y_N+B$ which is the sum of the detected laser energy $Y_N$ and a predetermined offset level B. If the sum $Y_N+B$ is larger, then the sequence goes back to step S3 and, by using the next voltage set level $X_N$, the exposure and the detection of the laser energy $Y_N$ are repeated. If at step S6 the sum $Y_N+B$ is not larger, then the sequence goes to step S7.

The above-described operations at steps S3-S6 are those processes wherein, within a voltage set level range, the set voltage is decreased successively from the maximum set level $X_{MAX}$ while the pulse energies $Y_N$ corresponding to the respective set levels $X_N$ are detected during the exposure, and wherein a measured data table of the voltage set level $X_N$ versus pulse energy, such as Table 1, is prepared.

Next, at step S7, a relational equation regarding the pulse energy versus voltage, i.e., an equation $X=f(Y)$, is determined. The levels at points between the measured points may be complemented by linear scaling, for example. At the stage of this determination of the relational equation, the exposure set voltage to be used thereafter is so determined at level $X_{AVE}$ that, at least within the range of pulse group E (FIG. 5), each pulse energy $Y_N$ to be provided has an average level $Y_{AVE}$ of all the pulse energies $Y_N$ of the pulse group D (FIG. 5), having been actually detected. In the range of pulse group E, the exposure is continued while keeping the voltage at $X_{AVE}$.

More specifically, at step S8, an average energy $Y_{AVE}$ of the pulse energies $Y_1$-$Y_N$ of the emitted pulses in pulse group D as measured, is calculated. Then, at step S9, by using the relational equation obtained at step S7, an average voltage level $X_{AVE}(=f(Y_{AVE}))$ for providing the average energy $Y_{AVE}$, is set. Thereafter, at step S10, the number N is incremented and, at step S11, exposure is effected with the voltage set level $X_{AVE}$. At step S12, the laser energy $Y_N$ actually measured through the sensor 5 and the integrating circuit 6 during the exposure with the voltage set level $X_{AVE}$, is added to the integrated exposure quantity SUM.

Then, at step S13, discrimination is made as to whether the sum of the integrated exposure quantity SUM and the exposure energy "$Y_{AVE} \times C$", which is determined in consideration of a maximum of output variation, is greater than the set total exposure quantity $Y_{TOTAL}$ or not. If not greater, then the sequence goes back to step S10 and the exposure with the voltage set level $X_{AVE}$ is repeated. If it is greater, the next pulse is the last pulse, and the sequence goes to step S14.

At step S14, the integrated exposure quantity SUM is subtracted from the total exposure quantity $Y_{TOTAL}$, to calculate the remaining exposure quantity $Y_R$. Then, at step S15, for execution of the last pulse exposure, a set voltage level $X_R$ with which the remaining exposure quantity $Y_R$ is obtainable is determined by using the relational equation $Y = f(X)$, obtained at step S7. Then, at step S16, one exposure operation is effected with the set voltage level $X_R$, whereby the exposure sequence is completed. The exposure energy for the remaining exposure quantity $Y_R$ may be provided by a plurality of exposure pulses. For example, such a voltage level $X_R'$ may be set for the remaining exposure quantity so that, by three pulses each providing an energy of one-third of the energy $Y_R$, the remaining exposure is effected.

With the exposure process as described with reference to FIG. 2, it is possible to suppress an error due to a variation of the laser pulses. Also, since in each exposure the relationship between the control parameter and the laser output is calibrated, it is possible to suppress an error due to degradation of a laser gas or of an optical part of a laser, which is inherent to the laser used, or an error due to a change with time of a light transmission optical system of the stepper. Thus, stable exposure control is assured.

Figure 4:
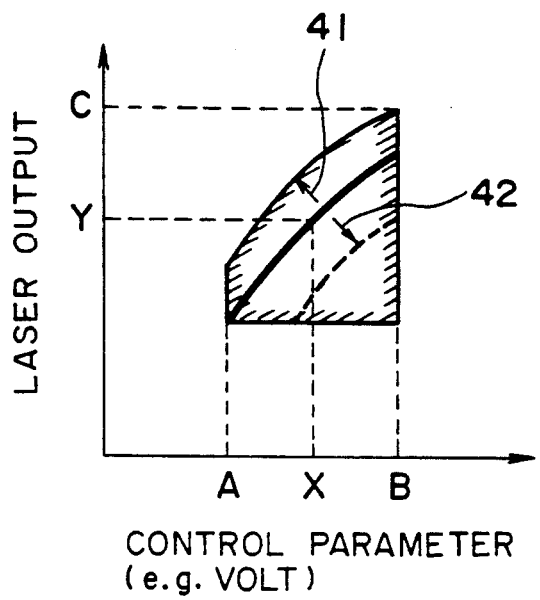
FIG. 4 is a graph showing the relationship between an applied control parameter and a laser output.

For determining the relationship between the set level and the pulse energy, there are many methods available. In a case of an ordinary excimer laser, within the voltage settable range (such as the range A-B in FIG. 4), there is an approximately rectilinear relationship between the set voltage level and the laser output. Thus, in the embodiment described above, a least square method is used to determine the relational equation f. It has been confirmed that a satisfactory result of exposure control precision not greater than 1%, is obtainable.

In the embodiment described above, the output versus voltage table is prepared each for a single exposure of a wafer (one complete exposure to one shot area of the wafer) and the exposure condition is calibrated each for the single exposure. However, depending on the stableness of a laser used or other optical components, the calibration of the relational equation may be done each for plural exposures, each for one wafer or each for a certain time period.

Figure 3:
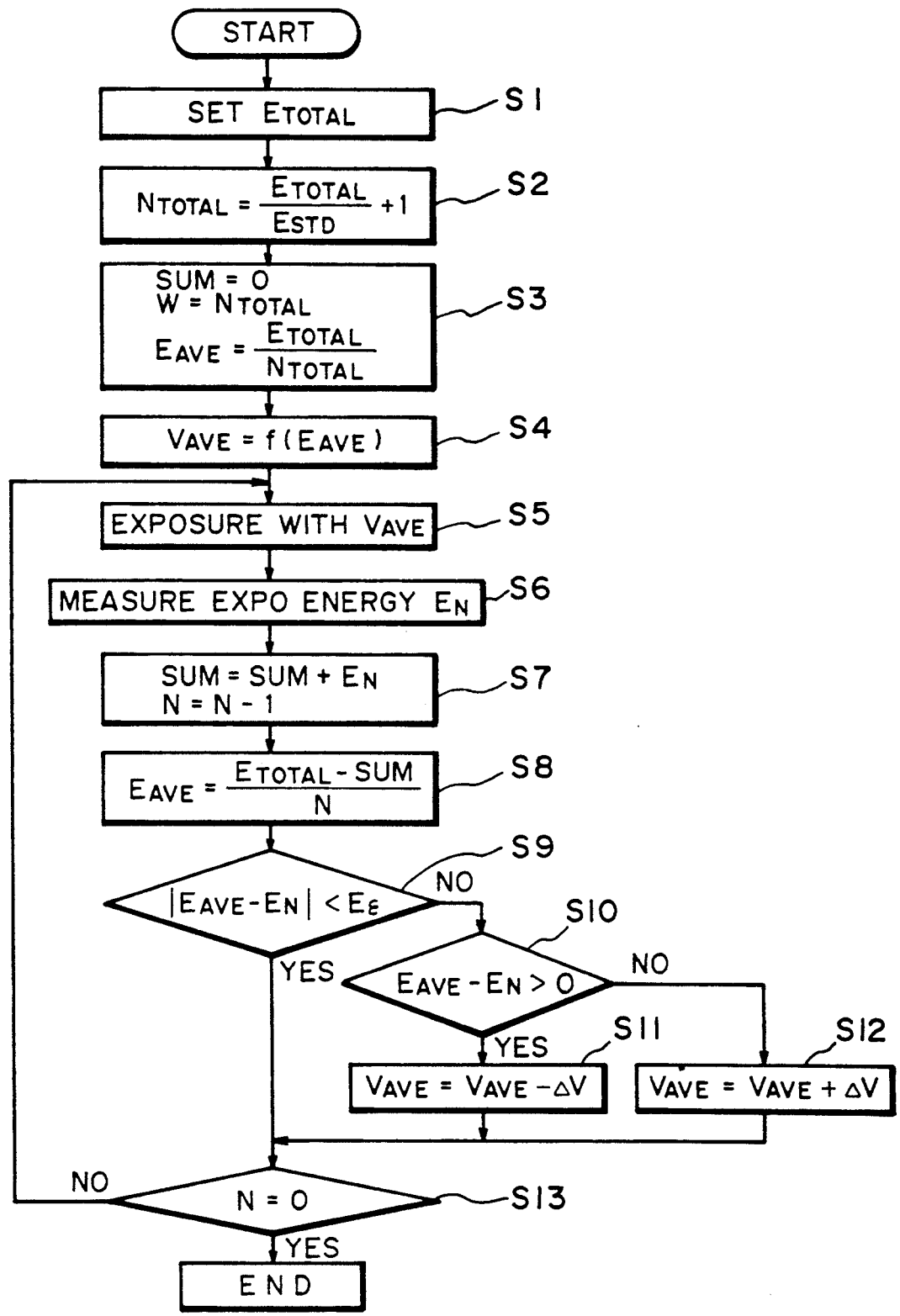
FIG. 3 is a flow chart showing another example of an exposure process sequence to be made in the exposure apparatus of FIG. 1.

FIG. 3 shows another example of an exposure sequence to be adopted in the exposure apparatus of this embodiment.

In this example, the exposure quantity is measured for each pulse and the measured quantity is integrated to obtain an integrated exposure quantity. The obtained integrated exposure quantity is subtracted from a total exposure quantity required, and an average pulse energy for the remaining exposure quantity is calculated. The set voltage level is so controlled that each pulse provides an energy substantially equal to or very close to the determined average energy.

First, at step S1, a total exposure quantity $E_{TOTAL}$ to be initially provided is set. Also, at step S2, the total number $N_{TOTAL}$ of exposures (pulses) is set on the basis of the total exposure quantity $E_{TOTAL}$ and a standard pulse energy $E_{STD}$. At step S3, the integrated exposure quantity SUM and the remaining number N of exposures (pulse emissions) as well as an average pulse energy $E_{AVE}$ are set. More specifically, the integrated exposure quantity is set to be equal to "0", the number N is set to be equal to "$N_{TOTAL}$", and the average pulse energy is set to be equal to "$E_{TOTAL}/N_{TOTAL}$". At step S4, the voltage level for initial exposure is set by using a voltage versus energy relational equation $V = f(E)$. At step S5, the laser output control device 8 operates to cause the light emission of the laser 1 with the set voltage level $V_{AVE}$ to effect the exposure of the reticle R and the wafer W. The actual exposure quantity $E_N$ is measured by using the sensor 5 and the integrating circuit 6 (step S6). Then, at step S7, the measured exposure quantity $E_N$ is added to the integrated exposure quantity SUM to renew the latter. Also, the number N is decremented. At step S8, the integrated exposure quantity SUM is subtracted from the total exposure quantity $E_{TOTAL}$. That is, the total remaining exposure quantity is calculated and it is divided by the remaining number N, whereby an average $E_{AVE}$ is determined. This average $E_{AVE}$ corresponds to the average exposure energy of each pulse for the remainder of the exposure.

At step S9, a comparison is made to the average exposure energy and the one pulse exposure energy $E_N$ having been exposed. If the difference between them is smaller than a predetermined condition $E_E$ of discrimination, the sequence goes to step S13. If the difference is not smaller than the condition of discrimination, at step S10, a further discrimination is made as the whether "$E_{AVE}-E_N$" is greater than zero or not. If greater, at step S11, a present quantity $\Delta V$ is added to the set voltage level $V_{AVE}$ to renew the latter. If "$E_{AVE}-E_N$" is not greater than zero, at step S12, the predetermined quantity $\Delta V$ is subtracted from the set voltage level $V_{AVE}$ to renew the latter. After step S11 or S12, the sequence goes to step S13. At step S13, discrimination is made as to whether the remaining number N of exposures (pulses) is equal to zero. If not zero, the sequence goes back to step S5. It it is zero, the exposure sequence is finished.

Figure 6:
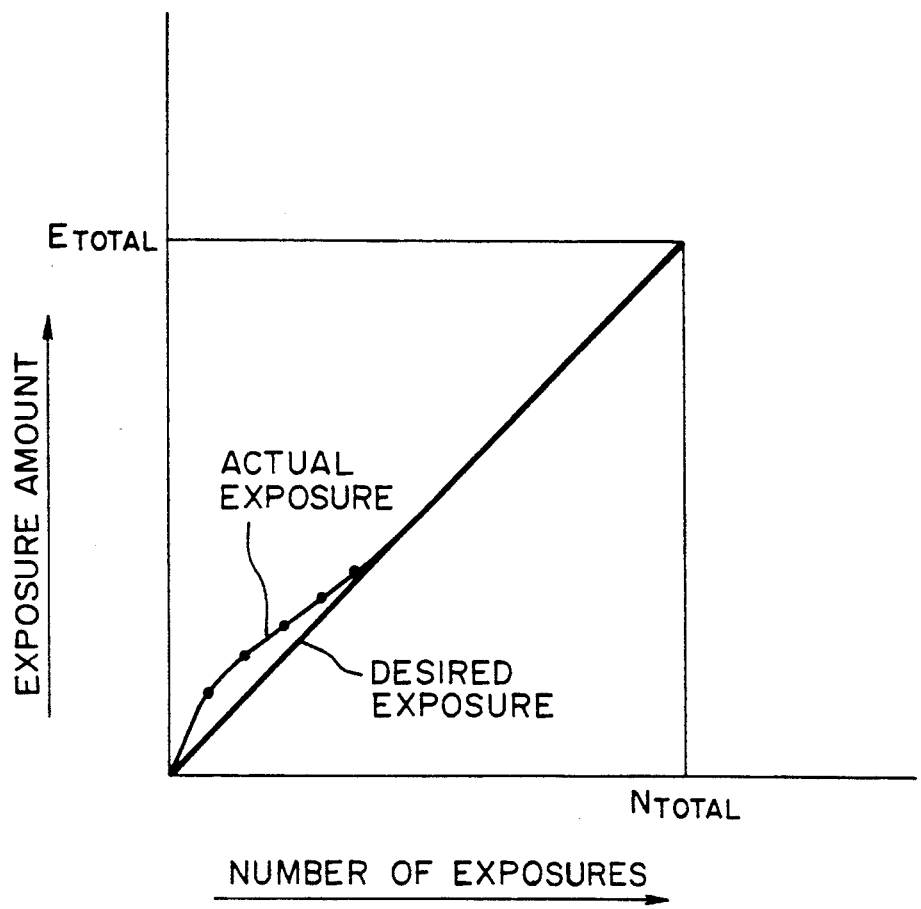
FIG. 6 is a graph showing changes in integrated exposure quantity, in accordance with the exposure sequence of FIG. 3.

FIG. 6 shows changes in the integrated exposure quantity. It is seen that, with the increasing number of exposures, the actual exposure quantity becomes closer to the target or desired exposure quantity.

With the exposure process as described with reference to FIG. 3, it is possible to suppress an error due to variation of laser pulses. Also, since for each pulse the target or set level is changed, it is possible to suppress an error due to degradation of a laser gas or of an optical part of a laser, which is inherent to the laser used, or an error due to a change with time of a light transmission optical system of the stepper. Thus, stable exposure control is assured.

In the example described above, the difference between the average energy $E_{AVE}$ for the remainder of exposure and the actual exposure quantity $E_N$ is used as a condition of discrimination (at steps S9 and S10). However, as the actual exposure quantity $E_N$, an average of the quantities of preceding exposures such as $E_{N-2}$ and $E_{N-1}$ or a weighted average of them such as "$(3E_N + 2E_{N-1} + E_{N-2})/6$" may be used. This is effective to prevent a sudden change of the condition and thus quick convergence of control to desired exposure quantity.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern to a substrate, said apparatus comprising:
   a light source for emitting pulses of light to expose the substrate;
   control means for controlling said light source in accordance with a control parameter, said control means causing said light source to emit the pulses of light in accordance with successively changed control parameters;
   detecting means for detecting a quantity related to the quantity of exposure of the substrate by each pulse of light from said light source and quantities related to the quantities of exposure of the substrate by the emitted pulses of light; and
   parameter determining means cooperating with said control means and said detecting means such that said parameter determining means determines the relationship between each control parameter and a corresponding quantity of exposure of the substrate on the basis of the quantities detected by said detecting means and wherein said parameter determining means further determines a control parameter for the subsequent light pulse emission of said light source on the basis of the determined relationship.

2. An apparatus according to claim 1, wherein said parameter determining means determines the control parameter so that a total exposure quantity of a predetermined zone of the substrate becomes equal to a predetermined quantity.

3. An apparatus according to claim 2, wherein said parameter determining means determines a control parameter for at least a last one pulse to be emitted for exposure of the predetermined zone of the substrate.

4. An exposure apparatus for transferring a pattern to a substrate, said apparatus comprising:
   a light source for producing pulses of light to expose the substrate;
   control means for controlling said light source in accordance with a control parameter;
   detecting means for detecting a quantity related to the quantity of exposure of the substrate by each pulse of light from said light source; and
   parameter determining means cooperating with said detecting means such that, from the quantity of exposure of a predetermined zone of the substrate detectable from the quantities detected by said detecting means in response to pulses of light from said light source, said parameter determining means calculates a remaining quantity of exposure of the zone and an average exposure quantity of each pulse to be emitted subsequently, and that said parameter determining means determines a control parameter for the subsequent pulses of light so that the quantity of exposure by each pulse corresponds to the average exposure quantity.

5. A semiconductor device manufacturing exposure method usable with a light source which produces pulses of light in accordance with a control parameter, said method comprising the steps of:
   causing the light source to produce pulses of light while successively changing the control parameter;
   detecting through a sensor each pulse of light from the light source;
   integrating outputs of the sensor corresponding to the pulses of light to determine a quantity of exposure of a predetermined zone of a substrate corresponding to each light pulse;
   determining, by using the determined exposure quantities corresponding to the pulses of light, a relational equation representing the relationship between each control parameter and a corresponding exposure quantity; and
   determining a control parameter for subsequent light pulse emission of the light source in accordance with the determined relational equation.

6. A method according to claim 5, further comprising effecting said detecting step after initiating exposure of the zone of the substrate with the pulses of light.

7. A method according to claim 5, further comprising using the control parameter set by said parameter determining step to control the light source for emission of at least a last one pulse for exposure of the zone.

8. A semiconductor device manufacturing method, comprising the steps of:
   controlling emission of pulses of a light source in accordance with a set control parameter;
   detecting the pulses from the light source with a sensor;
   detecting an integrated exposure amount in a particular region on a substrate, on the basis of an integrated output of the sensor;
   calculating a remainder exposure amount, on the basis of the integrated exposure amount and a predetermined exposure amount set with respect to the particular region, and calculating, with the remainder exposure amount, an average exposure amount for each subsequent pulse necessary for the subsequent pulse emission; and
   determining a set value for the control parameter to make the exposure amount of each subsequent pulse substantially equal to the average exposure amount.

* * * * *

UNITED STATES PATENT AND TRADEMARK OFFICE
CERTIFICATE OF CORRECTION

PATENT NO. : 5,250,797
DATED : October 5, 1993
INVENTOR(S) : NAOTO SANO, ET AL.

It is certified that error appears in the above-indentified patent and that said Letters Patent is hereby corrected as shown below:

IN THE DRAWINGS:

FIGURE 5

"EXPOSRE" should read --EXPOSURE--.

COLUMN 1:

Line 46, "of" should read --or--; and
Line 47, "of" should be deleted.

COLUMN 2:

Line 25, "lease" should read --least--.

COLUMN 4:

Line 12, " "O", " should read --"0",--.

UNITED STATES PATENT AND TRADEMARK OFFICE
CERTIFICATE OF CORRECTION

PATENT NO. : 5,250,797
DATED : October 5, 1993
INVENTOR(S) : NAOTO SANO, ET AL.

It is certified that error appears in the above-indentified patent and that said Letters Patent is hereby corrected as shown below:

COLUMN 6:

Line 27, "$E_E$" should read --$E_c$--;
Line 31, "zero" should read --zero (0)--;
Line 34, "zero," should read --zero (0),--; and
Line 39, "zero." should read --zero (0).--.

Signed and Sealed this

Seventh Day of June, 1994

Attest:

BRUCE LEHMAN

Attesting Officer  Commissioner of Patents and Trademarks